(12) United States Patent
Tran

(10) Patent No.: US 7,671,398 B2
(45) Date of Patent: Mar. 2, 2010

(54) NANO MEMORY, LIGHT, ENERGY, ANTENNA AND STRAND-BASED SYSTEMS AND METHODS

(76) Inventor: Bao Q. Tran, 6768 Meadow Vista Ct., San Jose, CA (US) 95135

( * ) Notice: Subject to any disclaimer, the term of this patent is extended or adjusted under 35 U.S.C. 154(b) by 735 days.

(21) Appl. No.: 11/369,103

(22) Filed: Mar. 6, 2006

(65) Prior Publication Data

US 2006/0198209 A1 Sep. 7, 2006

Related U.S. Application Data

(63) Continuation-in-part of application No. 11/064,363, filed on Feb. 23, 2005, now Pat. No. 7,019,391.

(51) Int. Cl.
*H01L 23/62* (2006.01)
(52) U.S. Cl. ............. 257/315; 257/213; 257/E23.074; 257/E23.165; 977/724; 977/734; 438/777
(58) Field of Classification Search ............. 257/213, 257/314–324, 415, 417, E23.074, E23.165; 977/724, 732, 733, 734, 742; 438/584
See application file for complete search history.

(56) References Cited

U.S. PATENT DOCUMENTS

| | | |
|---|---|---|
| 3,448,302 A | 6/1969 | Shanefield |
| 4,541,908 A | 9/1985 | Niki |
| 4,645,533 A | 2/1987 | Izumi |
| 4,668,932 A | 5/1987 | Drori |
| 4,853,693 A | 8/1989 | Eaton |
| 4,876,667 A | 10/1989 | Ross |
| 4,888,630 A | 12/1989 | Paterson |
| 5,063,521 A | 11/1991 | Peterson |
| 5,084,365 A | 1/1992 | Gratzel |
| 5,084,667 A | 1/1992 | Drori |
| 5,093,664 A | 3/1992 | Senn |
| 5,109,204 A | 4/1992 | Keefer |
| 5,161,157 A | 11/1992 | Owen |
| 5,198,994 A | 3/1993 | Natori |
| 5,296,858 A | 3/1994 | Moyal |
| 5,581,198 A | 12/1996 | Trimberger |
| 5,946,034 A | 8/1999 | Cortiula |
| 5,977,565 A | 11/1999 | Ishikawa |
| 6,044,008 A | 3/2000 | Choi |
| 6,128,214 A | 10/2000 | Kuekes |
| 6,159,620 A | 12/2000 | Heath |
| 6,198,655 B1 | 3/2001 | Heath |
| 6,331,768 B1 | 12/2001 | Drori |
| 6,366,318 B1 | 4/2002 | Smith |
| 6,379,753 B1 | 4/2002 | Soane |
| 6,380,336 B1 | 4/2002 | Soane |
| 6,387,492 B2 | 5/2002 | Soane |
| 6,472,476 B1 | 10/2002 | Soane |
| 6,485,530 B1 | 11/2002 | Soane |
| 6,497,732 B1 | 12/2002 | Soane |
| 6,497,733 B1 | 12/2002 | Ware |

(Continued)

*Primary Examiner*—W. David Coleman
*Assistant Examiner*—Su C Kim
(74) *Attorney, Agent, or Firm*—Tran & Associates

(57) ABSTRACT

An apparatus includes a plurality of wash durable clothing strands; an array of nano electronic elements fabricated in the strands; and an array of memory elements coupled to the nano electronic elements. The nano electronic elements can include solar cells, display elements, or antennas, among others.

20 Claims, 6 Drawing Sheets

U.S. PATENT DOCUMENTS

| | | |
|---|---|---|
| 6,500,571 B2 | 12/2002 | Liberatore |
| 6,516,633 B1 | 2/2003 | Erskine |
| 6,517,933 B1 | 2/2003 | Soane |
| 6,544,594 B2 | 4/2003 | Linford |
| 6,570,523 B1 | 5/2003 | Bacrania |
| 6,576,938 B1 | 6/2003 | Hirama |
| 6,599,327 B2 | 7/2003 | Soane |
| 6,605,836 B2 | 8/2003 | Kishi |
| 6,607,584 B2 | 8/2003 | Moreau |
| 6,607,994 B2 | 8/2003 | Soane |
| 6,617,267 B2 | 9/2003 | Soane |
| 6,617,268 B1 | 9/2003 | Offord |
| 6,617,384 B2 | 9/2003 | Wakabayashi |
| 6,621,936 B1 | 9/2003 | Kondo |
| 6,638,984 B2 | 10/2003 | Soane |
| 6,655,772 B2 | 12/2003 | Danzuka et al. |
| 6,671,166 B1 | 12/2003 | Penneau |
| 6,679,924 B2 | 1/2004 | Ware |
| 6,690,599 B2 | 2/2004 | Hasegawa et al. |
| 6,691,536 B2 | 2/2004 | Severns |
| 7,274,064 B2 * | 9/2007 | Bertin et al. ............... 257/315 |
| 7,335,528 B2 * | 2/2008 | Rueckes et al. ............ 438/99 |
| 2001/0023986 A1 | 9/2001 | Mancevski |
| 2001/0044114 A1 | 11/2001 | Connolly |
| 2002/0027124 A1 | 3/2002 | Bashir |
| 2002/0071947 A1 | 6/2002 | Soane |
| 2002/0094515 A1 | 7/2002 | Erlach |
| 2002/0096633 A1 | 7/2002 | Gimzewski |
| 2002/0098472 A1 | 7/2002 | Erlach |
| 2002/0114557 A1 | 8/2002 | Zhang |
| 2002/0120988 A1 | 9/2002 | Soane |
| 2002/0122890 A1 | 9/2002 | Linford |
| 2002/0139961 A1 | 10/2002 | Kinoshita |
| 2002/0150524 A1 | 10/2002 | Smalley |
| 2002/0152560 A1 | 10/2002 | Soane |
| 2002/0154535 A1 | 10/2002 | Bocian |
| 2002/0155771 A1 | 10/2002 | Soane |
| 2002/0158374 A1 | 10/2002 | Billiet |
| 2002/0160675 A1 | 10/2002 | Linford |
| 2002/0163414 A1 | 11/2002 | Mayer |
| 2002/0174660 A1 | 11/2002 | Venkatasubramanian |
| 2002/0189024 A1 | 12/2002 | Soane |
| 2003/0003300 A1 | 1/2003 | Korgel |
| 2003/0008078 A1 | 1/2003 | Soane |
| 2003/0008931 A1 | 1/2003 | Soane |
| 2003/0008932 A1 | 1/2003 | Soane |
| 2003/0064532 A1 | 4/2003 | Chen |
| 2003/0079302 A1 | 5/2003 | Soane |
| 2003/0081463 A1 | 5/2003 | Bocian |
| 2003/0082444 A1 | 5/2003 | Kuhr |
| 2003/0089899 A1 | 5/2003 | Lieber |
| 2003/0099834 A1 | 5/2003 | Erskine |
| 2003/0101518 A1 | 6/2003 | Linford et al. |
| 2003/0101522 A1 | 6/2003 | Linford |
| 2003/0104134 A1 | 6/2003 | Linford |
| 2003/0111670 A1 | 6/2003 | Misra |
| 2003/0121764 A1 | 7/2003 | Yang |
| 2003/0136943 A1 | 7/2003 | Alivisatos |
| 2003/0138777 A1 | 7/2003 | Evans |
| 2003/0139907 A1 | 7/2003 | McCarthy |
| 2003/0141189 A1 | 7/2003 | Lee |
| 2003/0145397 A1 | 8/2003 | Ware |
| 2003/0145779 A1 | 8/2003 | Alivisatos |
| 2003/0146095 A1 | 8/2003 | Edman |
| 2003/0169618 A1 | 9/2003 | Lindsey |
| 2003/0171257 A1 | 9/2003 | Stirbl |
| 2003/0174384 A1 | 9/2003 | Halas |
| 2003/0177450 A1 | 9/2003 | Nugent |
| 2003/0178617 A1 | 9/2003 | Appenzeller |
| 2003/0186522 A1 | 10/2003 | Duan |
| 2003/0189402 A1 | 10/2003 | Gaudiana |
| 2003/0200521 A1 | 10/2003 | DeHon |
| 2003/0207978 A1 | 11/2003 | Yadav |
| 2003/0209810 A1 | 11/2003 | Moon |
| 2003/0215903 A1 | 11/2003 | Hyman |
| 2003/0230746 A1 | 12/2003 | Stasiak |
| 2004/0002064 A1 | 1/2004 | Fang |
| 2004/0016318 A1 | 1/2004 | Angeliu |
| 2004/0029706 A1 | 2/2004 | Barrera |
| 2004/0048541 A1 | 3/2004 | Offord |
| 2004/0055093 A1 | 3/2004 | Offord |
| 2004/0071990 A1 * | 4/2004 | Moriyama et al. .......... 428/458 |
| 2004/0106341 A1 * | 6/2004 | Vogt et al. .................. 442/117 |
| 2004/0142168 A1 | 7/2004 | Hrubesh |
| 2004/0194224 A1 | 10/2004 | Offord |
| 2005/0009224 A1 | 1/2005 | Yang |
| 2005/0029622 A1 * | 2/2005 | Marr et al. .................. 257/530 |
| 2005/0106713 A1 * | 5/2005 | Phan et al. ............... 435/287.2 |

* cited by examiner

NANO MEMORY, LIGHT, ENERGY, ANTENNA AND STRAND-BASED SYSTEMS AND METHODS

This application is a continuation in part (CIP) application claiming priority to U.S. application Ser. No. 11/064,363, filed Feb. 23, 2005 now U.S. Pat. No. 7,019,391 and entitled "Nano Electronic IC Packaging", the content of which is incorporated by reference.

BACKGROUND

This invention relates in general to nano electronic devices.

Important characteristics for a memory cell in electronic device are low cost, nonvolatility, high density, low power, and high speed. Conventional memory solutions include Read Only Memory (ROM), Programmable Read only Memory (PROM), Electrically Programmable Memory (EPROM), Electrically Erasable Programmable Read Only Memory (EEPROM), Dynamic Random Access Memory (DRAM) and Static Random Access Memory (SRAM).

ROM is relatively low cost but cannot be rewritten. PROM can be electrically programmed but with only a single write cycle. EPROM has read cycles that are fast relative to ROM and PROM read cycles, but has relatively long erase times and reliability only over a few iterative read/write cycles. EEPROM (or "Flash") is inexpensive, and has low power consumption but has long write cycles (ms) and low relative speed in comparison to DRAM or SRAM. Flash also has a finite number of read/write cycles leading to low long-term reliability. ROM, PROM, EPROM and EEPROM are all non-volatile, meaning that if power to the memory is interrupted the memory will retain the information stored in the memory cells.

DRAM stores charge on transistor gates that act as capacitors but must be electrically refreshed every few milliseconds complicating system design by requiring separate circuitry to "refresh" the memory contents before the capacitors discharge. SRAM does not need to be refreshed and is fast relative to DRAM, but has lower density and is more expensive relative to DRAM. Both SRAM and DRAM are volatile, meaning that if power to the memory is interrupted the memory will lose the information stored in the memory cells.

Consequently, existing technologies are either non-volatile but are not randomly accessible and have low density, high cost, and limited ability to allow multiples writes with high reliability of the circuit's function, or they are volatile and complicate system design or have low density. Some emerging technologies have attempted to address these shortcomings.

For example, magnetic RAM (MRAM) or ferromagnetic RAM (FRAM) utilizes the orientation of magnetization or a ferromagnetic region to generate a nonvolatile memory cell. MRAM utilizes a magnetoresisitive memory element involving the anisotropic magnetoresistance or giant magnetoresistance of ferromagnetic materials yielding nonvolatility. Both of these types of memory cells have relatively high resistance and low-density. A different memory cell based upon magnetic tunnel junctions has also been examined but has not led to large-scale commercialized MRAM devices. FRAM uses a circuit architecture similar to DRAM but which uses a thin film ferroelectric capacitor. This capacitor is purported to retain its electrical polarization after an externally applied electric field is removed yielding a nonvolatile memory. FRAM suffers from a large memory cell size, and it is difficult to manufacture as a large-scale integrated component. More details are discussed in U.S. Pat. Nos. 4,853,893; 4,888,630; and 5,198,994, the contents of which are incorporated by reference.

Another technology having non-volatile memory is phase change memory. This technology stores information via a structural phase change in thin-film alloys incorporating elements such as selenium or tellurium. These alloys are purported to remain stable in both crystalline and amorphous states allowing the formation of a bistable switch. While the nonvolatility condition is met, this technology appears to suffer from slow operations, difficulty of manufacture and reliability and has not reached a state of commercialization. More details are discussed in U.S. Pat. Nos. 3,448,302; 4,845,533; 4,876,667; 6,044,008, the contents of which are incorporated by reference.

Wire crossbar memory (MWCM) has also been disclosed in U.S. Pat. Nos. 6,128,214; 6,159,620; and 6,198,655, the contents of which are incorporated by reference. These memory proposals envision molecules as bistable switches. Two wires (either a metal or semiconducting type) have a layer of molecules or molecule compounds sandwiched in between. Chemical assembly and electrochemical oxidation or reduction are used to generate an "on" or "off" state. This form of memory requires highly specialized wire junctions and may not retain nonvolatility owing to the inherent instability found in redox processes. Memory devices have been proposed which use nanoscopic wires, such as single-walled carbon nanotubes, to form crossbar junctions to serve as memory cells. Typically, individual single-walled nanotube wires suspended over other wires define memory cells. Electrical signals are written to one or both wires to cause them to physically attract or repel relative to one another. Each physical state (i.e., attracted or repelled wires) corresponds to an electrical state. Repelled wires are an open circuit junction. Attracted wires are a closed state forming a rectified junction. When electrical power is removed from the junction, the wires retain their physical (and thus electrical) state thereby forming a non-volatile memory cell.

In a parallel trend, as discussed in United States Patent Application 20030121764, nanowires are often thin strands of conductive or semiconductive materials with diameters in the nanometer range to a few hundred nanometers. The nanowires have been operated in a room-temperature, ultraviolet lasing mode. These devices can convert electrical energy into light energy. United States Patent Application 20050009224 mentions the high cost of manufacturing conventional solar cells limits their widespread use as a source of power generation. The construction of conventional silicon solar cells involves four main processes: the growth of the semiconductor material, separation into wafers, formation of a device and its junctions, and encapsulation. For cell fabrication alone, numerous steps are required to make the solar cell and many of these steps require high temperatures (300° C.-1000° C.), high vacuum or both. In addition, the growth of the semiconductor from a melt is at temperatures above 1400° C. under an inert argon atmosphere. To obtain high efficiency devices (>10%), structures involving concentrator systems to focus sunlight onto the device, multiple semiconductors and quantum wells to absorb more light, or higher performance semiconductors such as GaAs and InP, are needed. These options all result in increased costs.

Recently, advances in textile technology have resulted in improved fabrics and textiles. For example, U.S. Pat. No. 6,821,936 discloses that silver-containing inorganic microbiocides can be utilized as antimicrobial agents on and within a plethora of different substrates and surfaces. In particular, such microbiocides have been adapted for incorporation within melt spun synthetic fibers in order to provide certain fabrics which selectively and inherently exhibit antimicrobial characteristics. Furthermore, attempts have been made to apply such specific microbiocides on the surfaces of fabrics and yarns with little success from a durability standpoint. A topical treatment with such compounds has never been successfully applied as a durable finish or coating on a fabric or yarn substrate. Although such silver-based agents provide excellent, durable, antimicrobial properties, to date such is the sole manner available within the prior art of providing a long-lasting, wash-resistant, silver-based antimicrobial textile. However, such melt spun fibers are expensive to make due to the large amount of silver-based compound required to provide sufficient antimicrobial activity in relation to the migratory characteristics of such a compound within the fiber itself to its surface. A topical coating is also desirable for textile and film applications, particularly after finishing of the target fabric or film.

Such a topical procedure permits treatment of a fabric's individual fibers prior to or after weaving, knitting, and the like, in order to provide greater versatility to the target yarn without altering its physical characteristics. Such a coating, however, must prove to be wash durable, particularly for apparel fabrics, in order to be functionally acceptable. Furthermore, in order to avoid certain problems, it is highly desirable for such a metallized treatment to be electrically non-conductive on the target fabric, yarn, and/or film surface. The '936 patent applies a treatment with silver ions, particularly as constituents of inorganic metal salts or zeolites in the presence of a resin binder, either as a silver-ion overcoat or as a component of a dye bath mixture admixed with the silver-ion antimicrobial compound.

United States Patent Application 20040142168 discloses fibers, and fabrics produced from the fibers, are made water repellent, fire-retardant and/or thermally insulating by filling void spaces in the fibers and/or fabrics with a powdered material. When the powder is sufficiently finely divided, it clings to the fabric's fibers and to itself, resisting the tendency to be removed from the fabric.

SUMMARY

In one aspect, systems and methods are disclosed for forming a nanowire data storage device. In one embodiment, a memory device includes a first array of nano-scale memory elements; and a decoder coupled to the first array to select one of the nano-scale memory elements. In another embodiment, an array of deformable nanowires is activated and/or sensed by a multidimensional read/write head. In other embodiments, a non-volatile, nanoscale memory array is provided. In one embodiment, an electronic memory cell uses at least one organic single molecule memory (SMM) in combination with a switch element (such as a transistor). Arranging these memory cells into rows and columns forms a memory array. Peripheral access circuitry allows individual addressing capability for each of the electronic memory cells. The access circuitry is fabricated from semiconductor elements. The electronic memory array uses an array of nanowires formed above an array of electrodes. The memory cells in the array are addressed either serially or in parallel by using appropriate read/write access techniques. Different redundant techniques are used to minimize losses due to defective cells in the row or column of the memory array.

In another aspect, systems and methods are disclosed for forming a nanowire data storage device. In one embodiment, a memory device includes a first array of nano-scale memory elements; and a decoder coupled to the first array to select one of the nano-scale memory elements. In another embodiment, an array of deformable nanowires is activated and/or sensed by a multidimensional read/write head.

Advantages of the data storage devices may include one or more of the following. The data storage devices have high density, low power consumption, non-volatility and high speed.

In one aspect, an apparatus includes a plurality of wash durable clothing strands; an array of nano electronic elements fabricated in the strands; and an array of memory elements coupled to the nano electronic elements. The nano electronic elements can include solar cells, display elements, or antennas, among others.

In another aspect, nanowires emit light as well as convert light into electrical energy. The array includes a first portion of light harvesting molecules operating with a second portion of light emitting molecules. In one implementation, the first and second portions are positioned side by side. In yet another implementation, the first portion can be transparent and positioned on top. In yet another implementation, the second portion is transparent and positioned above the first position. The array of light harvesting and light emitting molecules generate electricity when light is available and illuminate during periods of darkness.

In one implementation, the nanowires are used as a computer display screen so that the display generates power while it is rendering images on the screen. In another implementation, the nanowires are used to capture and convert light energy into electrical energy stored in a battery so that the energy can be used to power the nanowires for light emission at night.

Advantages of the light emitting/conversion aspect may include one or more of the following. The system emits light without requiring external power when sunlight is shining on the unit. The system effectively combines multiple components required to generate power and light into a single integrated circuit device. The complete integration of components greatly reduces manufacturing costs. The system provides for fast, easy migration of existing designs to high performance, high efficiency single chip solutions.

In yet another aspect, a method is set forth for forming a flexible electrically conducting nanowire cloth. The method comprises contacting substantially the entire surfaces of a plurality of intermingled or interwoven fibers of a nano material.

Implementations of the nanowire cloth aspect may include one or more of the following. The nanowires can form data storage devices such as memory arrays, light emitting or light conversion devices, or energy conversion devices. The fibers can be covered with a coating that exhibits a sheet resistance which lies between about 0.1 ohm per square and about 1,000 ohms per square. Such coated fibers can be used as antenna materials as well.

DETAILED DESCRIPTION

Figure 1:
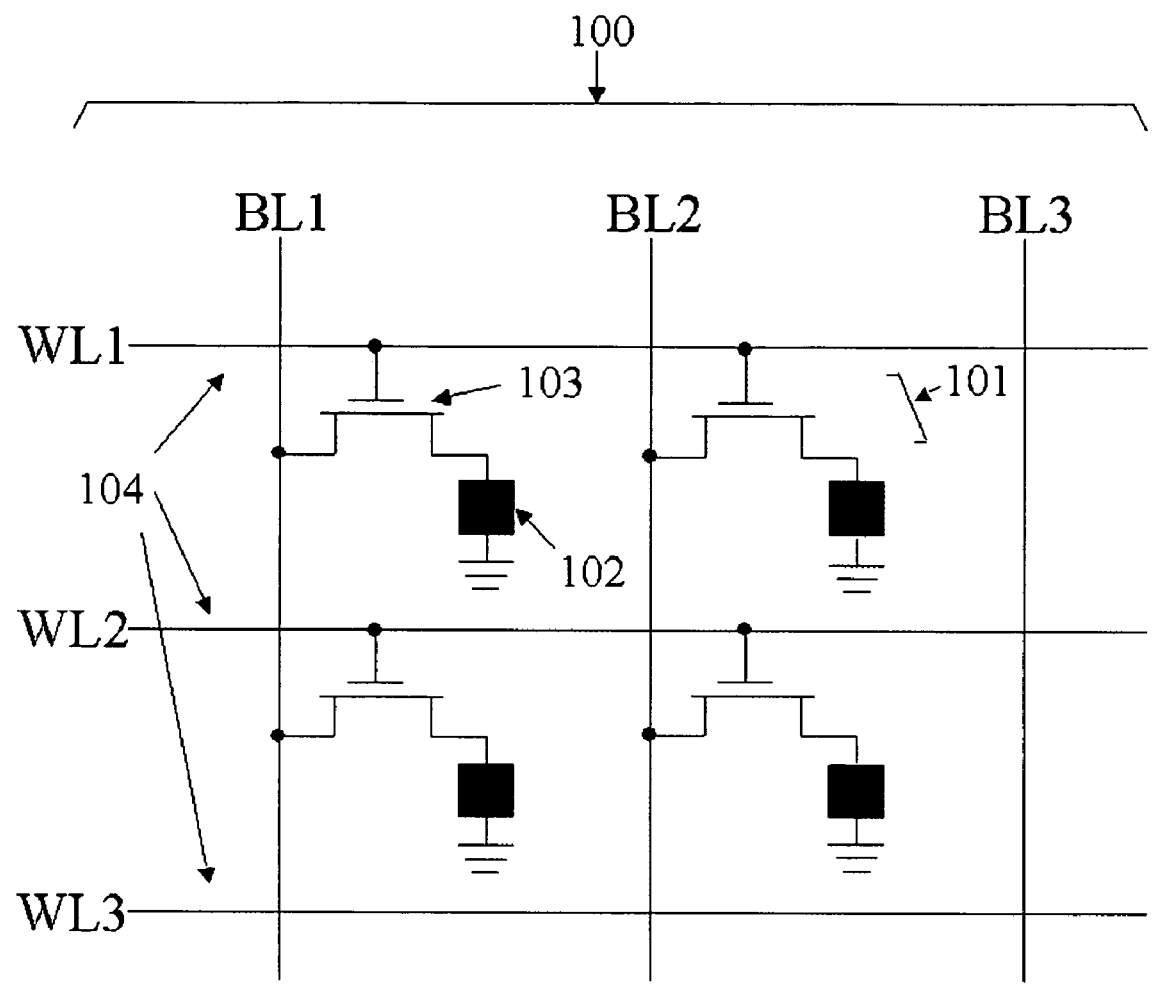
FIG. 1 illustrates a schematic of an exemplary single molecule memory array.

FIG. 1 illustrates a schematic of a single molecule memory array according to certain embodiments of the invention. An array 100 is formed by arranging a plurality of memory elements 101 into rows and columns. These memory elements can be either in an ON state or an OFF state, depending on their voltage and current conditions. Each memory element consists of a single molecule memory (SMM) 102 in combination with a gate or switch 103.

In one embodiment, conventional DRAM cells are fabricated, and then the SMMs 102 are formed above the conventional DRAM cells. In another embodiment, in the final stages of DRAM fabrication, DRAM capacitor are not formed and in lieu thereof SMM elements are formed using spin-coating techniques so that there is only one layer of nano memory elements. The memory elements can be addressed through parallel lines of wires 104 in communication with electrodes. The system is fabricated on a silicon substrate and the cells can be electrically isolated from one another using insulators like silicon nitride or silicon oxide grown and patterned on the silicon wafers.

Another embodiment uses a stacked DRAM cell organization where, due to small size of SMM, a plurality of standard DRAM cells each having one port to attach to one SMM can be vertically stacked into the same cell so that after spin coating each of the SMMs only self-assembles to one port on the stacked memory cell. Stacking can be done since the SMMs require much less space than comparable capacitors). The SMMs self-assemble to attach only to the port during spin-coating.

Figure 2:
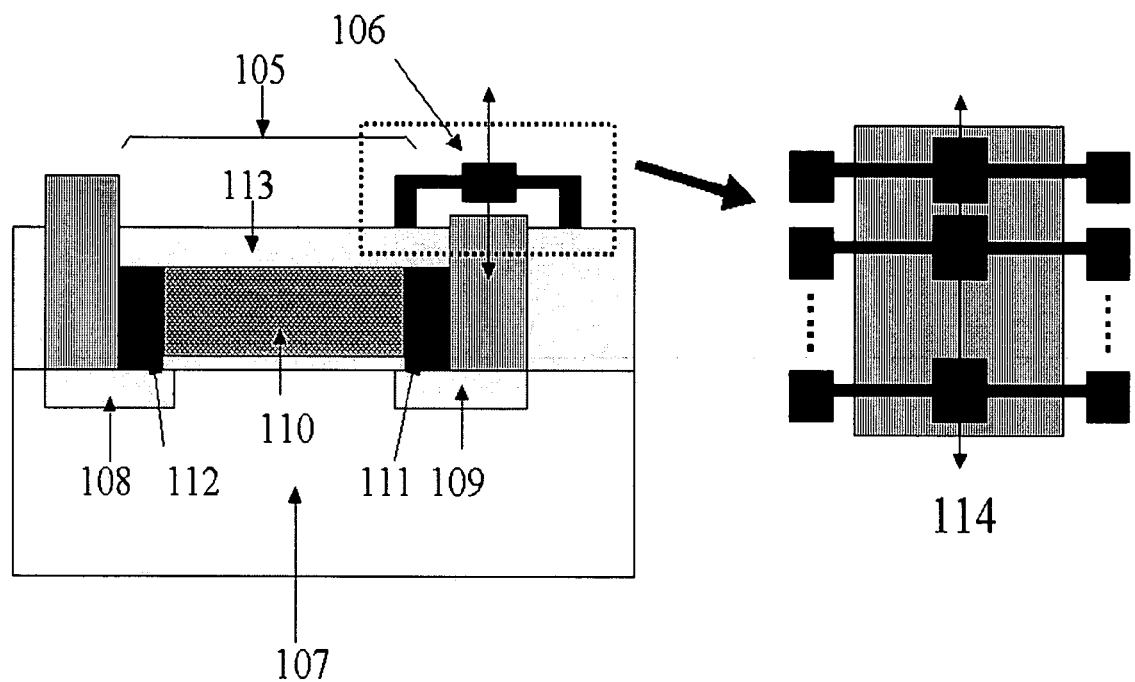
FIG. 2 illustrates an exemplary single molecule memory cell.

FIG. 2 illustrates the SMM cell according to certain embodiments of the invention. The individual memory cell consists of a switch 105, such as a MOSFET, connected to an SMM 106. The MOSFET is made from a silicon substrate and. In one embodiment, rests above a conventional DRAM capacitor cell structure 107, while in a second embodiment, the conventional DRAM capacitor cell structure is not fabricated (empty) and the structure 107 may be non-functional silicon or other suitable materials. The MOSFET has two doped regions connected to the source and drain electrodes 108-109 and a gate dielectric on top of which rests a polysilicon or metal gate 110 connected to a gate electrode (not shown). The spacers 111-112, which isolate the gate from the source and drain electrodes, are made of silicon oxide or nitride or a combination of the two. The entire structure is insulated using a dielectric like silicon oxide 113. Instead of using a capacitor like in the case of a conventional DRAM cell, the SMMs can be deposited on the electrode using one of several organic film deposition techniques like electropolymerization, solution-processed deposition, vacuum evaporation, screen printing, or Langmuir-Blodgett technique. One preferred technology uses spin-coating techniques to realize a homogenous films in the last step of fabrication. In spin-coating, an organic material is dropped onto the wafer surface which is then spun at several revolutions per minute to uniformly coat the surface. The RPM determines the uniformity and thickness of the spin-coated organic device. After spin-coating, using predetermined thermodynamic conditions, the SMMs can selectively self-assemble only at the output port of the access transistor. The thermodynamic driving force for self-assembly could come about by the different interactions between a part of the molecule and the electrodes, the molecules themselves or a combination of the two. The relatively simple, low temperature and low-cost process can be easily performed at the end of the transistor fabrication process.

Redundant techniques are applied to minimize losses due to defective cells in the row or column of memory. While the nature of the data storage in the SMM is not important for the functioning of the memory array, the data manifests itself in the form of current or voltage change, which can then be read out through the wires. The data can be stored in the SMMs in various forms, such as, a red-ox state of a molecule, a physical deformation of the molecule or even simply charge stored across a SMM capacitor. The data can be written into the SMM cells through parallel wires, which are then electrically connected to electrodes.

Figure 3:
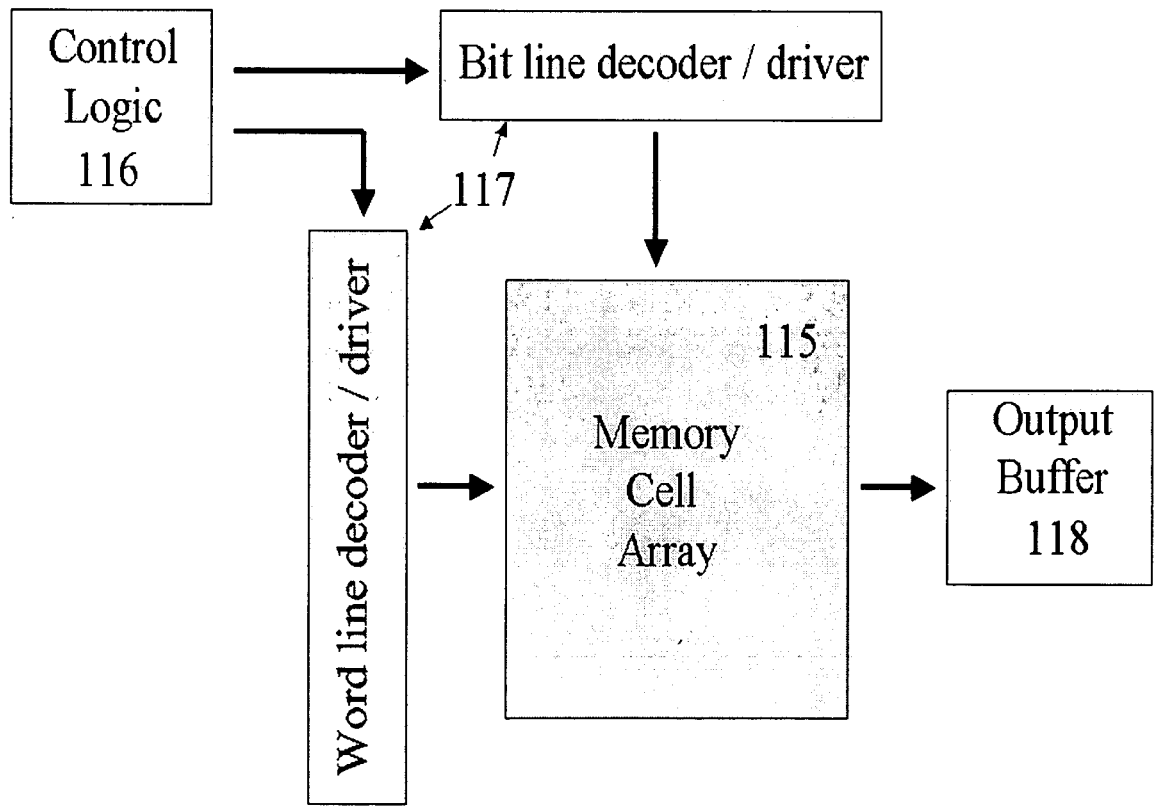
FIG. 3 illustrates the addressing logic for certain memory embodiments.

FIG. 3 illustrates exemplary addressing logic for certain embodiments. The architecture consists of all the elements of the memory cell connected through wires in rows and columns to form a memory array 115. The wires are then connected to a set of electrodes, which interface the memory array to the input/output system. The electrodes and wires arranged in rows are the word lines and the electrodes and wires arranged in columns are the bit lines. Each individual memory element can be selected by a combination of voltages and currents applied across the bit lines and the word lines. An as exemplary case, when the $n^{th}$ word line is high and the $m^{th}$ bit line is high, then the $(m,n)^{th}$ element in the array can be selected out of the entire array to be written into or read out from. The bit lines and word lines are controlled by control logic 116 which sends out the information to select a particular memory element to the word and bit line. The word and bit line decoders decode 117 this information and convert it into a set of voltages or currents, which drive the electrodes of the memory array to select out a single element from the array. The output of the selected memory element can then be read out of an output buffer 118. The control logic, the decoders/drivers and the output buffer are all fabricated using standard semiconductor elements.

Figure 4:
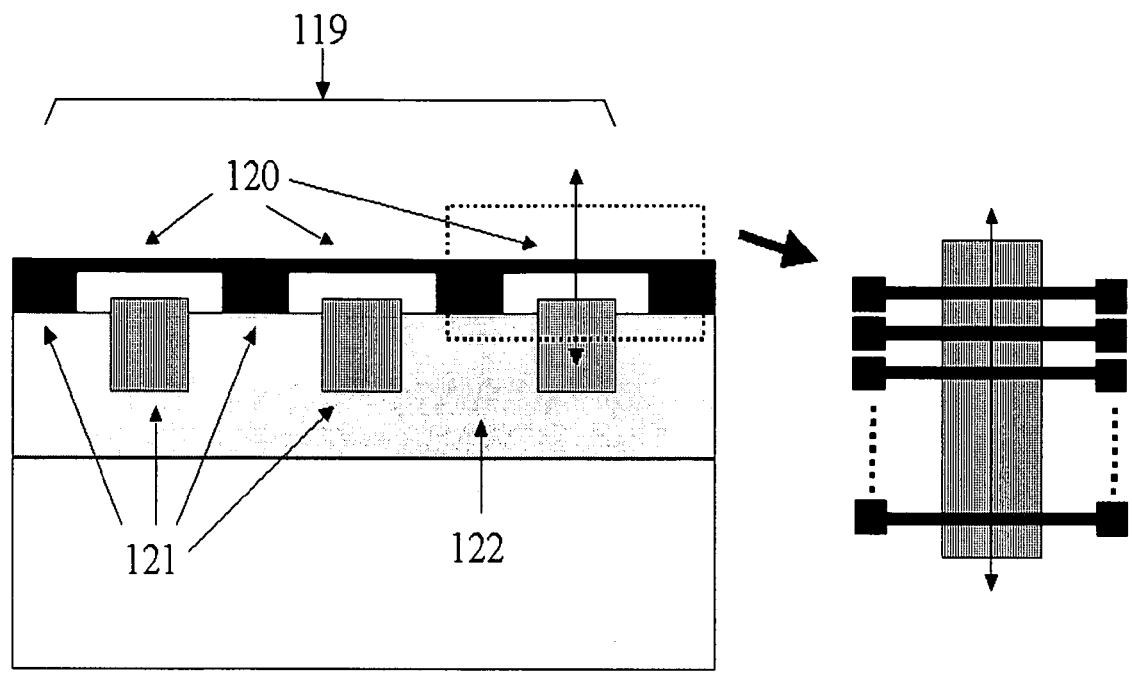
FIG. 4 illustrates a nanowire crossbar memory array according to certain embodiments of the invention.

FIG. 4 illustrates a nanowire crossbar memory 119 array according to another memory embodiment. In this embodiment, nanoscale memory structures are implemented instead of the standard DRAM cell structure. In these embodiments, an array of nanowires 120 is formed above an array of electrodes 121. The number of memory elements present in the array is for illustrative purposes only. The memory elements can be addressed through parallel lines of wires in communication with electrodes. During operation, when a voltage is applied to the appropriate row/column, the nanowire deforms at the intersection of a row/column where a voltage is applied. The deformation causes the nanowire to short to either ground or VDD. The memory is non-volatile and operates at high speed. The entire architecture is fabricated on a silicon substrate. In one embodiment, the nano-cell can be electrical isolated from one another above conventional DRAM cell 122. Alternatively, the cells can be electrical isolated from one another using dielectric materials such as silicon oxide.

Figure 5:
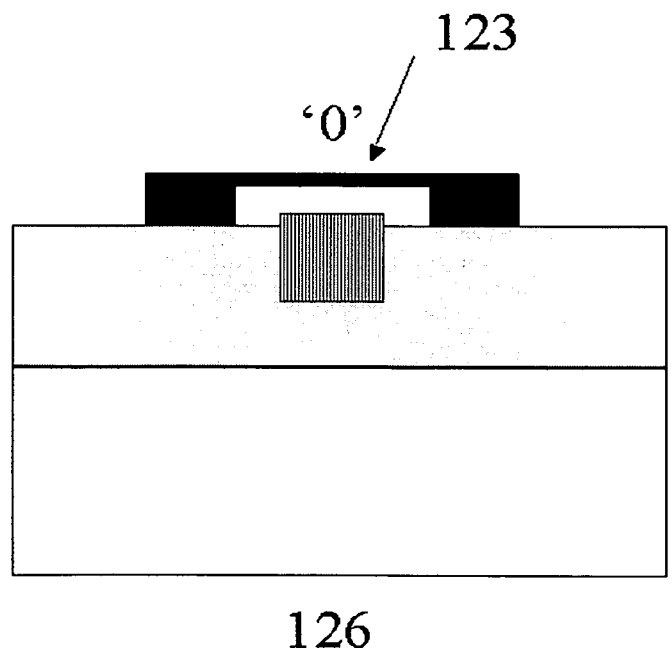
FIG. 5A-B illustrate the two states of the exemplary nanowire crossbar memory array of FIG. 4.
Figure 5:
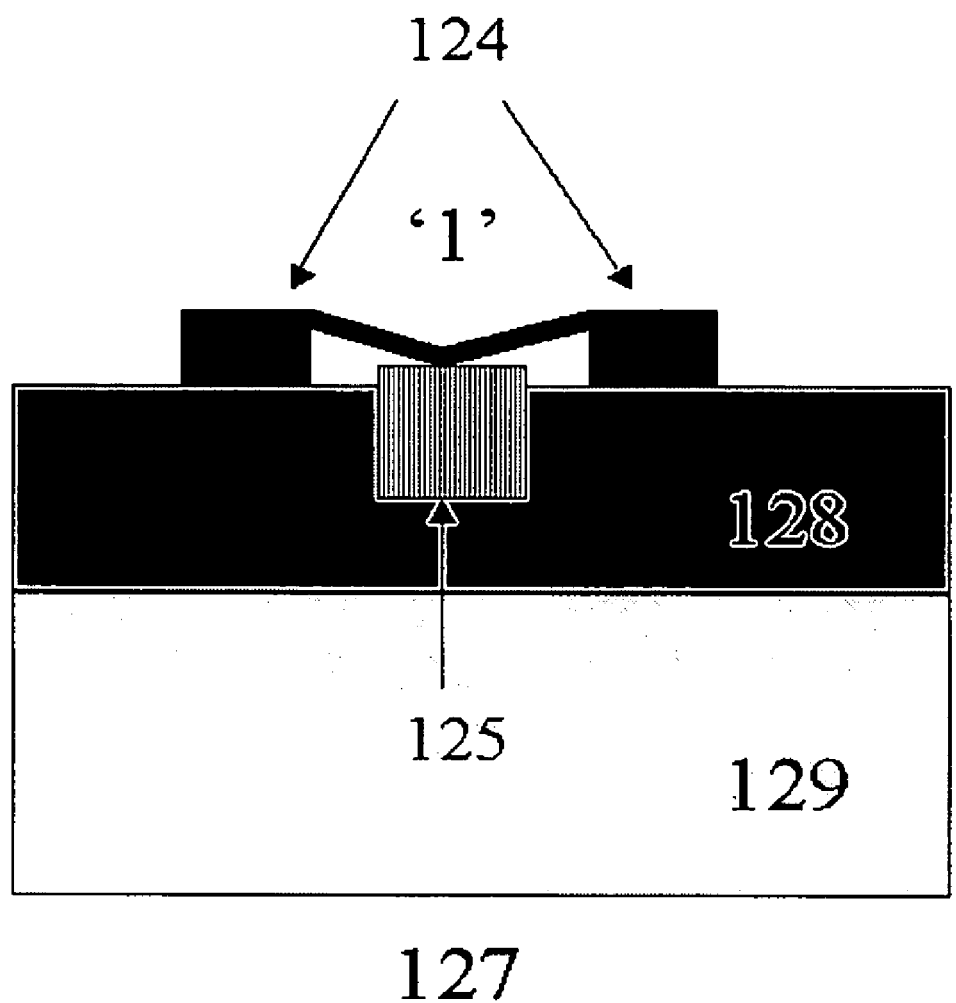

FIGS. 5A-B illustrate the two states of the nanowire crossbar memory array according to certain embodiments of the invention. The memory element consists of at least a single nanowire 123 bridged between two electrodes 124 and a third bottom electrode 125, which controls the deformation of the nanowire. When the nanowire is in the '0' state 126, the wire rests in its neutral state and does not have any deformation associated with it. As a result, it is electrically isolated from the bottom electrode since it does not contact it. However, when a voltage is applied to the bottom electrode, it attracts the nanowire causing it to deform and eventually contact and short the nanowire to a predetermined voltage such as ground or Vdd. In this state, due to the forces of interaction—Van der Waals forces—between the nanowire and the bottom electrode 125, the nanowires 123 remains contacted with the electrode 125 even after the applied bias is removed. This is the '1' state 127 of the memory element.

In one embodiment, the memory cell may be fabricated by patterning parallel conducting wires 123 on an insulating dielectric 128 that may be grown or deposited on a silicon substrate 129, which may include a conventional DRAM cell therein and the memory cell can be formed above the conventional DRAM cell. A matted layer of nanowires can then be grown or deposited on top of these metallic electrodes to form bridges of nanowires suspended between two electrodes 123. The nanowires may be patterned to control the density of the nanowires in a particular location. One or more nanowires may be used to form a bridge between the bottom electrodes in one cell.

The SMM organic memory array uses dedicated nanoscale wires to provide redundancy to overcome breakage of wires during processing. In one embodiment, the redundant wires are simply formed over the electrodes and if one of the wires is broken, the remaining wires provide the redundant coverage. In one implementation, each wire is tested against a known input and the wire that passes all memory test procedures is selected as the valid wire.

In another embodiment, each wire "votes" when the memory cell is queried, and the value of a majority of concurring outputs wins (for example, in a cell with seven wires, if four wires vote for a particular value, then the output is that value. This embodiment provides redundancy needed for military or space applications where reliability is important.

In yet another embodiment, a 2D array of nanowires can form a cross-bar configuration for logic and memory devices thereon. Current control in the nanowires or nanotube is exerted using gates or by forming diode junctions. FET behavior is achieved using metallic gates and crossing nanowires or nano-tubes. By varying the amount of oxide grown at their intersection, crossing nanowires or nanotubes can be made such that one nanowire forms a diode with the other, or one acts as a FET gate to the other. The SMM can be attached to the 2D array to provide data storage capacity in addition to the logic gates. However, such 2D array of nanowires that provide logic and memory capacity, the nanowires can fail. To maximize yield, redundancy is used as numerous nanowires can be fabricated at once.

In one embodiment, software during testing identifies broken nanowires and specifies a replacement routing over redundant nanowires using a learning machine such as a neural network, perceptron, or any self-organized network of nano memory elements to deselect defective memory elements. In one implementation, the neural network learns using genetic algorithms where the weights and biases of all the neurons are joined to create a single vector. A certain set of vectors is a correct solution to the classification of defective, broken or otherwise non-functional nanowires and to reroute the connections to functioning or "fit" nanowires. In this implementation, the process is as follows:

choose initial population of nanowires
    evaluate each individual nanowire's fitness
    repeat
        select individual nanowires
        mate nanowires pairs at random
        apply crossover operator
        apply mutation operator
        evaluate each individual nanowire's fitness
    until terminating condition The learning loop can terminate either if a satisfactory solution is found, or the number of generations pass a preset limit, suggesting that a complete solution will not be found with this set of individuals.

In our case, we have several seperated populations, all of which evolve seperately. Once every several generations, the process allows cross-over from different populations of nanowires.

In yet another embodiment, instead of having binary states 126 and 127 as shown in FIGS. 5A and 5B, the memory element can store a plurality of values based on the degree of coupling of the wire 123 to the electrode 125. In one embodiment, the electrode 125 can deform the wire 123 in 256 steps. In another implementation, the electrode 125 can provide voltages (or currents) that have 256 discrete values. The number of steps or discrete values is exemplary, and the device can have more or less steps or discrete values. In yet another implementation, the SMM stores photons or light charges and such an array can act as an imager for camera or imaging applications.

In one implementation, the nanowires form neural networks with learning capability. Artificial neural networks have inter-connected units which serve as model neurons. The synapse is modeled by a modifiable weight associated with each particular connection. For a neural network to perform a specific task the connection between units must be specified and the weights on the connections must be set appropriately. The connections determine whether it is possible for one unit to influence another. The weights specify the strength of the influence. In this implementation, the weights are stored in the SMM. The artificial networks express the electrical output of a neuron as a single number that represents the rate of firing. Each unit converts the pattern of incoming activities that it receives into a single outgoing activity that it sends to other units. This conversion is performed in two steps: 1) it multiplies each incoming activity by the weight on the connection and adds together all these weighted inputs to get a total input; 2) the unit uses an input output function that transform the total input into an outgoing activity. The global behavior of an artificial neural network depends on both the weight and the input-output function that is specified for the unit. This function typically falls into one of three categories: linear, threshold or sigmoid. For linear units, the output activity is proportional to the total weighted input—For threshold units the output is set at one of two levels, depending on whether the total input is greater than, or less than some threshold value. In sigmoid units, the output varies continuously but not linearly as the input changes. Sigmoid units bear a greater resemblance to real neurons than linear or threshold units.

In one implementation, the artificial neural network consists of three groups or layers of units. An input layer is connected to a layer of intermediate units (called hidden units), which is in turn connected to a layer of output units. The activity of the input units represents the incoming external information that is fed into the network. The activity of each hidden unit is determined by the activities of the input units and the weights on the connections between the input and hidden units. The behavior of the output units depends in turn, on the activity of the hidden units and the weights between the hidden and output units. The hidden units are free to construct their own representation of the input. The weights between the input and hidden units determine when each hidden unit is active. By modifying these weights a hidden unit can choose what it represents.

The three layer network can be trained as follows: first the network is presented with a training example consisting of a pattern of activities for the input units together with the pattern that represents the desired output. Then it is determined how closely the actual output matches the desired output. Next the weight of each connection is changed in order to produce a better approximation of the desired output.

Figure 6:
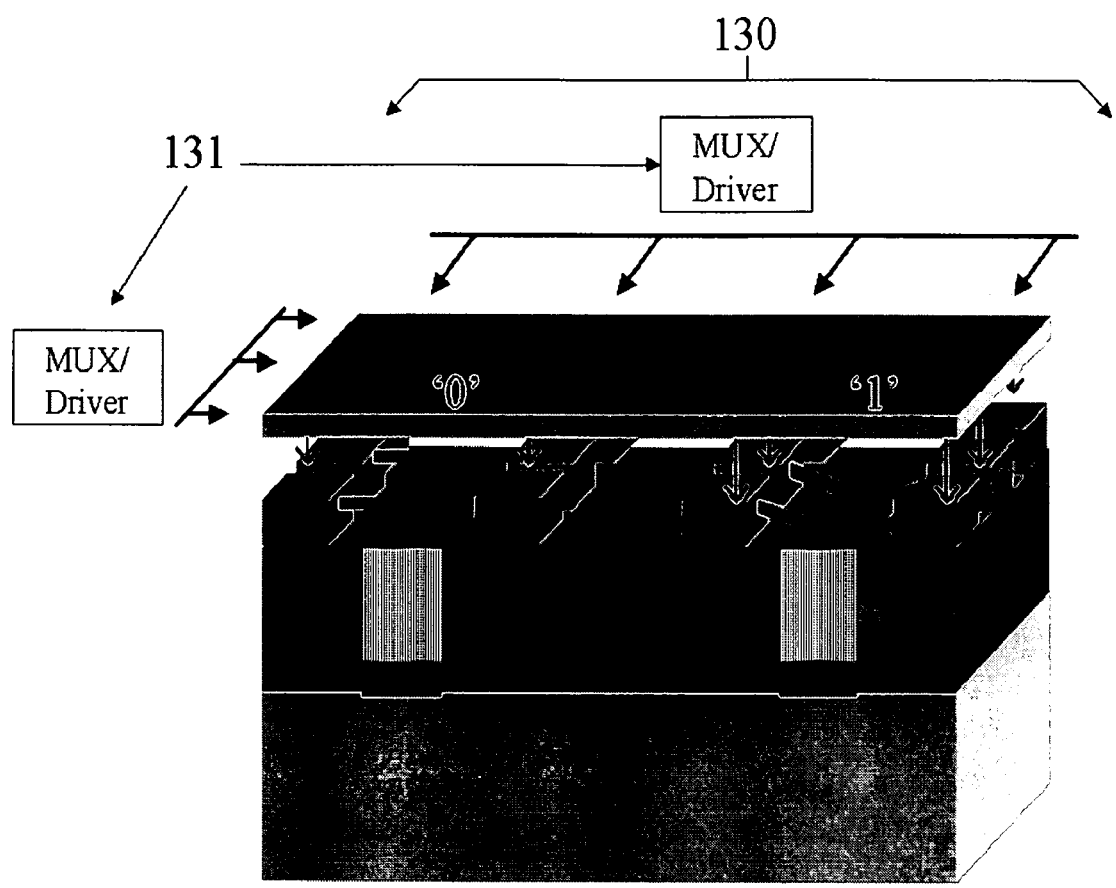
FIG. 6 illustrates a parallel read-write embodiment.

FIG. 6 illustrates the parallel read-write technique according to some embodiments of the invention. In yet another embodiment of the nanowire memory array, instead of using row and column decoders, an array of deformable nanowires is formed on a substrate and a multi-dimensional read/write head 130 causes the wires to deform. The head 130 operates in parallel and can write 256, 512, 1024, and 2048 bits at a time. In this implementation, the head 130 is advantageously used as a voltage or mechanical probe, which in turn is activated by a current flowing through it or a voltage applied to it. When the head is used as a voltage probe, a voltage appearing at the end of the probe appears across the nanowire, causing the nanowire to either switch to a '1' state or a '0' state. The head can also be used to read out the state of the memory cell by applying a new voltage across the electrodes and measuring the current flowing through them between them without disturbing the state of the nanowire in the cell, thus maintaining non-volatility. The individual cantilever voltage probes are controlled through a multiplexer-driver circuit 131 made from standard semiconductor elements, which determine the voltage appearing across each of the probes and hence the data that should be written by the two-dimensional head. The main advantage of this type of read-write techniques is the ability to write a large number of bits at the same time, thus speeding up the memory access time. In other embodiments, the head can have m by n probes (2 dimensional head) and in yet other embodiments, the head can have m by n by o probes (3 dimensional head).

In another aspect, a power producing solar cell is made using nano-wires. In one embodiment, the first portion includes excitonic solar cells including organic, hybrid organic/inorganic and dye-sensitized cells with a thick nanoparticle film that provides a large surface area for the adsorption of light-harvesting molecules. The nanowires can be used in conjunction with existing LCD displays. One embodiment uses a reduced version of standard LCD cell-layout and fabrication, except a final processing step coats the LCD with the nanowires using spin-coating process. The nanowires self-assemble to attach only to designated spots in the LCD array during spin-coating. Conventional LCD manufacturing techniques are used until the last step of spin-coating the nanowires onto the LCD cell organization where the nanowires can self-assemble into the display array. Redundant techniques are applied to minimize losses due to defective cells in the row or column of the display. Variations of nanowires can be used. For example, only light harvesting nanowires can be spin coated onto the LCD cells, or alternatively only light emitting nanowires can be spin coated onto the LCD cells, or alternatively both light harvesting and emitting nanowires are spin-coated onto the LCD wafer. In another implementation, the array can be made from flexible materials such as plastics and can be used as a housing for other electronics such as processor and memory embedded therein.

In yet another embodiment, the array can be attached to a wall to light up a room or be placed on a floor or ceiling to illuminate a pathway or to accentuate certain features of a house. In yet other embodiment, the array can be embedded into furniture.

Figure 7:
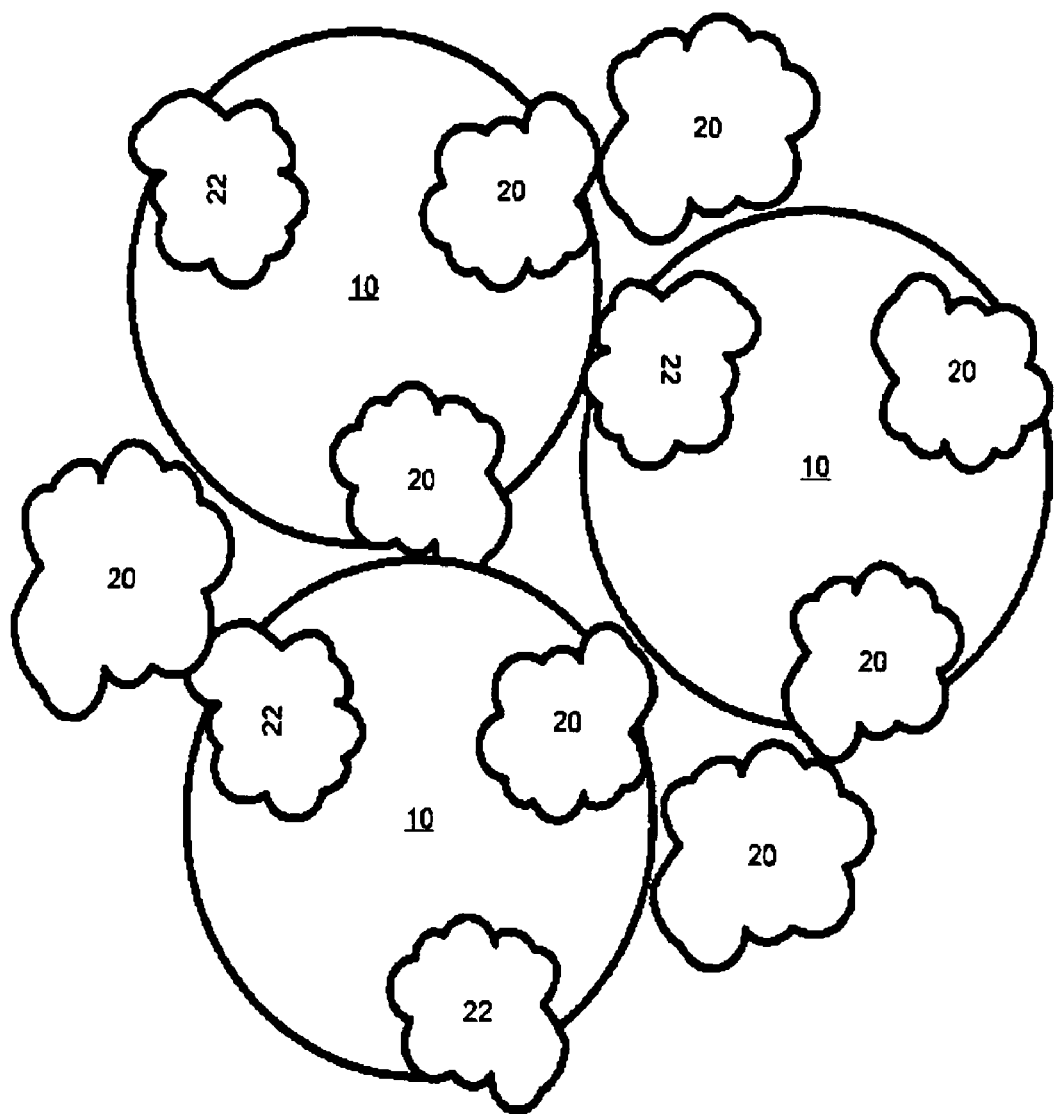
FIG. 7 shows a cross-sectional view of a portion of a substrate made up of strands of smaller fibers.

In another embodiment, the nanowires can be embedded in a strand of clothing to provide wearable electronic devices. FIG. 7 shows a cross-sectional view of a portion of a substrate made up of strands of smaller fibers 10. The smaller single fiber strands 10 can be either small porous or non-porous fiber strands. The porous fiber strands can have individual voids 20 and 22. The smaller single fiber strands can be either small porous or non-porous fiber strands. The porous fiber strands can have individual voids. Some of the voids are at least partially filled with particles in the size range below 100 nm. Void volumes can also exist between the smaller single porous or non-porous fiber strands and a portion of the void volume is at least partially filled with particles in the size range of less than 100 nm. In one embodiment, the voids are provided with a composition having nano-particles. The voids contain first nano-particles that wick up moisture from the user's skin, the voids contain second nano-particles that repel rain from the fabric, and the voids can contain electronic devices such as data storage devices, light capture or light emission devices and energy storage devices. The substrate includes fibers, woven and non-woven fabrics derived from natural or synthetic fibers or blends of such fibers, as well as cellulose-based papers, and the like. They can include fibers in the form of continuous or discontinuous monofilaments, multifilaments, staple fibers, and yarns containing such filaments and/or fibers, which fibers can be of any desired composition. The fibers can be of natural, manmade, or synthetic origin. Mixtures of natural fibers, manmade fibers, and synthetic fibers can also be used. Examples of natural fibers include cotton, wool, silk, jute, linen, and the like. Examples of man-made fibers include regenerated cellulose rayon, cellulose acetate and regenerated proteins. Examples of synthetic fibers include polyesters (including polyethyleneterephthalate and polypropyleneterephthalate), polyamides (including nylon), acrylics, olefins, aramids, azlons, modacrylics, novoloids, nytrils, aramids, spandex, vinyl polymers and copolymers, vinal, vinyon, Kevlar®, and the like.

The nanosize particles form projections on the outside or sheath of the smaller fibers and the single fiber. The available void spaces in the fibers and between strands of smaller fibers are filled with a nanoporous material. In one embodiment, silver particles are distributed evenly or unevenly along the length of the strand or fiber. Nano-particles such as silver, gold, aluminum, or similar particles can be used. The nano-particles can be obtained by chemical techniques such as reduction, or non chemical techniques such as laser treatment or mechanical ablation from a solid. The reflecting particles can be coated with a surfactant. The nano-particles impart to the fabric/textile one or more of the cleaning, insulating, waterproofing, and fire resistant properties. Fibers and fabrics produced from the fibers are made water repellent, dirt repellant, fire-retardant and/or thermally insulating by filling the void spaces in the fibers and/or fabrics with a finely powdered material. The particles can be a nanoporous material, a nanoporous powdered material, a solgel derived material, an aerogel-like material, an aerogel, an insulating material, a thermally insulating material, a water repellant material, a hydrophobic material, a water repellant material, a hydrophobic material, a hydrophobic silica aerogel, a fire resistant material, or a mixture of the foregoing materials. The substrate can be one of: an individual yarn, a textile, a fabric, or a film. The nano-particles can be an antimicrobial compound, a fireproofing compound, an insulating compound, or an anti-odor compound. The nano-particles can be a metal such as silver, gold, aluminum, or any suitable metals. The nano-particles can also be a non-metal. The projections are self-assembled. Each strand can have a first portion to absorb water and a second portion to repel water. The first portion wicks moisture from skin and the second portion repels moisture from the material. The nano-particles can contract at a predetermined temperature, or expand at a predetermined temperature. The nano-particles can be applied to the substrate containing the strands by soaking, spin casting, dipping, fluid-flow, padding, or spraying a solution containing the nano-particles on the substrate. Next, the substrate with the nano-particles is dried. In one embodiment, the drying occurs at room temperature, thus facilitating manufacturing and minimizes costs while being environmentally friendly.

Since the nano-particles are embedded in the strand, they are secured to the fabric or textile material. The nano-particles substantially remain after the substrate is washed at least 40 times in accordance with the wash procedure of AATCC Test Method 130-1981. For example, at least 80% of the nano-particles remain after the substrate is washed at least 40 times in accordance with the wash procedure of AATCC Test Method 130-1981. The nano-particles can be applied to natural (cotton, wool, and the like) or synthetic fibers (polyesters, polyamides, polyolefins, and the like) as a substrate, either by itself or in any combinations or mixtures of synthetics, naturals, or blends or both types. As for the synthetic types, for instance, and without intending any limitations therein, polyolefins, such as polyethylene, polypropylene, and polybutylene, halogenated polymers, such as polyvinyl chloride, polyesters, such as polyethylene terephthalate, polyester/polyesters, polyamides, such as nylon 6 and nylon 6,6, polyurethanes, as well as homopolymers, copolymers, or terpolymers in any combination of such monomers, and the like, may be utilized. Nylon 6, Nylon 6,6, polypropylene, and polyethylene terephthalate (a polyester) are particularly preferred. Additionally, the target fabric may be coated with any number of different films, including those listed in greater detail below. Furthermore, the substrate may be dyed or colored to provide other aesthetic features for the end user with any type of colorant, such as, for example, poly (oxyalkylenated) colorants, as well as pigments, dyes, tints, and the like. Other additives may also be present on and/or within the target fabric or yarn, including antistatic agents, brightening compounds, nucleating agents, antioxidants, UV stabilizers, fillers, permanent press finishes, softeners, lubricants, curing accelerators, and the like. Soil release agents can be used to provide hydrophilicity to the surface of polyester. With such a modified surface, again, the fabric imparts improved comfort to a wearer by wicking moisture. In one embodiment, the nano-particles can include copolymers containing a fluorinated monomer, an alkyl monomer, a reactive monomer (e.g., hydroxyethylmethacrylate, N-methylol acrylamide), and various other auxiliary monomers (e.g. vinylidene chloride, polyethylene glycol methacrylate, etc.) that impart water and oil repellent finish to textiles. In yet other embodiments, the nano-particles can include stain-releasing finish with an acrylate copolymer emulsion, an aminoplast resin, a resin catalyst, or polymers that contain carboxyl groups, salts of carboxyl groups. In another embodiment that achieves wrinkle resistance for cotton substrates, the nano-particles can include alcohol groups on adjacent cellulose chains. The nano-particles are partially crosslinked to keep the chains fixed relative to each other. Crosslinking agents (resins) for durable-press properties include isocyanates, epoxides, divinylsulfones, aldehydes, chlorohydrins, N-methylol compounds, and polycarboxylic acids. In another aspect, the nano-particles can include Fullerene molecular wires. In one embodiment, the bonding wires can be FSAs or self-assembly assisted by binding to FSA or fullerene nano-wires. Choice of FSAs can also enable self-assembly of compositions whose geometry imparts useful chemical or electrochemical properties including operation as a catalyst for chemical or electrochemical reactions, sorption of specific chemicals, or resistance to attack by specific chemicals, energy storage or resistance to corrosion. Examples of biological properties of FSA self-assembled geometric compositions include operation as a catalyst for biochemical reactions; sorption or reaction site specific biological chemicals, agents or structures; service as a pharmaceutical or therapeutic substance; interaction with living tissue or lack of interaction with living tissue; or as an agent for enabling any form of growth of biological systems as an agent for interaction with electrical, chemical, physical or optical functions of any known biological systems.

FSA assembled geometric structures can also have useful mechanical properties which include but are not limited to a high elastic to modulus weight ratio or a specific elastic stress tensor. Self-assembled structures, or fullerene molecules, alone or in cooperation with one another (the collective set of alternatives will be referred to as "molecule/structure") can be used to create devices with useful properties. For example, the molecule/structure can be attached by physical, chemical, electrostatic, or magnetic means to another structure causing a communication of information by physical, chemical, electrical, optical or biological means between the molecule/structure and other structure to which the molecule/structure is attached or between entities in the vicinity of the molecule/structure. Examples include, but are not limited to, physical communication via magnetic interaction, chemical communication via action of electrolytes or transmission of chemical agents through a solution, electrical communication via transfer of electronic charge, optical communication via interaction with and passage of any form with biological agents between the molecule/structure and another entity with which those agents interact.

The nanowires in the strands can also act as antennas. For example, the lengths, location, and orientation of the molecules can be determined by FSAs so that an electromagnetic field in the vicinity of the molecules induces electrical currents with some known phase relationship within two or more molecules. The spatial, angular and frequency distribution of the electromagnetic field determines the response of the currents within the molecules. The currents induced within the molecules bear a phase relationship determined by the geometry of the array. In addition, application of the FSAs could be used to facilitate interaction between individual tubes or groups of tubes and other entities, which interaction provides any form of communication of stress, strain, electrical signals, electrical currents, or electromagnetic interaction. This interaction provides an "interface" between the self-assembled NANO structure and other known useful devices. In forming an antenna, the length of the NANO tube can be varied to achieve any desired resultant electrical length. The length of the molecule is chosen so that the current flowing within the molecule interacts with an electromagnetic field within the vicinity of the molecule, transferring energy from that electromagnetic field to electrical current in the molecule to energy in the electromagnetic field. This electrical length can be chosen to maximize the current induced in the antenna circuit for any desired frequency range. Or, the electrical length of an antenna element can be chosen to maximize the voltage in the antenna circuit for a desired frequency range. Additionally, a compromise between maximum current and maximum voltage can be designed. A Fullerene NANO tube antenna can also serve as the load for a circuit. The current to the antenna can be varied to produce desired electric and magnetic fields. The length of the NANO tube can be varied to provide desired propagation characteristics. Also, the diameter of the antenna elements can be varied by combining an optimum number of strands of NANO tubes. Further, these individual NANO tube antenna elements can be combined to form an antenna array. The lengths, location, and orientation of the molecules are chosen so that electrical currents within two or more of the molecules act coherently with some known phase relationship, producing or altering an electromagnetic field in the vicinity of the molecules. This coherent interaction of the currents within the molecules acts to define, alter, control, or select the spatial, angular and frequency distributions of the electromagnetic field intensity produced by the action of these currents flowing in the molecules. In another embodiment, the currents induced within the molecules bear a phase relationship determined by the geometry of the array, and these currents themselves produce a secondary electromagnetic field, which is radiated from the array, having a spatial, angular and frequency distribution that is determined by the geometry of the array and its elements. One method of forming antenna arrays is the self-assembly monolayer techniques discussed above.

Various molecules or NANO-elements can be coupled to one or more electrodes in a layer of an IC substrate using standard methods. The coupling can be a direct attachment of the molecule to the electrode, or an indirect attachment (e.g. via a linker). The attachment can be a covalent linkage, an ionic linkage, a linkage driven by hydrogen bonding or can involve no actual chemical attachment, but simply a juxtaposition of the electrode to the molecule. In one embodiment, a "linker" is used to attach the molecule(s) to the electrode. The linker can be electrically conductive or it can be short enough that electrons can pass directly or indirectly between the electrode and a molecule of the storage medium. The manner of linking a wide variety of compounds to various surfaces is well known and is amply illustrated in the literature. Means of coupling the molecules will be recognized by those of skill in the art. The linkage of the storage medium to a surface can be covalent, or by ionic or other non-covalent interactions. The surface and/or the molecule(s) may be specifically derivatized to provide convenient linking groups (e.g. sulfur, hydroxyl, amino, etc.). In one embodiment, the molecules or NANO-elements self-assemble on the desired electrode. Thus, for example, where the working electrode is gold, molecules bearing thiol groups or bearing linkers having thiol groups will self-assemble on the gold surface. Where there is more than one gold electrode, the molecules can be drawn to the desired surface by placing an appropriate (e.g. attractive) charge on the electrode to which they are to be attached and/or placing a "repellant" charge on the electrode that is not to be so coupled.

The FSA bonding wires can be used alone or in conjunction with other elements. A first group of elements includes palladium (Pd), rhodium (Rh), platinum (Pt), and iridium (Ir). As noted in US Patent Application Serial No. 20030209810, in certain situations, the chip pad is formed of aluminum (Al). Accordingly, when a gold-silver (Au—Ag) alloy bonding wire is attached to the chip pad, the Au of the bonding wire diffuses into the chip pad, thereby resulting in a void near the neck. The nano-bonding wire, singly or in combination with the elements of the first group form a barrier layer in the interface between a Au-rich region (bonding wire region) and an Al-rich region (chip pad region) after wire bonding, to prevent diffusion of Au and Ag atoms, thereby suppressing intermetallic compound and Kirkendall void formation. As a result, a reduction in thermal reliability is prevented.

Nano-wires can also be used singly or in combination with a second group of elements that includes boron (B), beryllium (Be), and calcium (Ca). The elements of the second group enhances tensile strength at room temperature and high temperature and suppresses bending or deformation of loops, such as sagging or sweeping, after loop formation. When an ultra low loop is formed, the elements of the second group increase yield strength near the ball neck, and thus reduce or prevent a rupture of the ball neck. Especially, when the bonding wire has a small diameter, a brittle failure near the ball neck can be suppressed. Nano-bonding wires can also be used singly or in combination with a third group of elements that includes phosphorous (P), antimony (Sb), and bismuth (Bi). The elements of the third group are uniformly dispersed in an Au solid solution to generate a stress field in the gold lattice and thus to enhance the strength of the gold at room temperature. The elements of the third group enhance the tensile strength of the bonding wire and effectively stabilize loop shape and reduce a loop height deviation.

Nano-bonding wires can also be used singly or in combination with a fourth group of elements that includes magnesium (Mg), thallium (Tl), zinc (Zn), and tin (Sn). The elements of the fourth group suppress the grain refinement in a free air ball and soften the ball, thereby preventing chip cracking, which is a problem of Au—Ag alloys, and improving thermal reliability.

The nano-bonding wires provide superior electrical characteristics as well as mechanical strength in wire bonding applications. In a wire bonding process, one end of the nano bonding wire is melted by discharging to form a free air ball of a predetermined size and pressed on the chip pad to be bound to the chip pad. The electronics can be embedded inside clothing made from the nano-fabric or textile. The textile/fabric substrate can interconnect a number of other chips. For example, in a plastic flexible clothing substrate, a solar cell is mounted, printed or suitably positioned at a bottom layer to capture photons and convert the photons into energy to run the credit card operation. Display and processor electronics are then mounted or on the plastic substrate. A transceiver chip with nano antennas is also mounted or printed on the plastic substrate. The nano antenna can be the nano-particles embedded into the strands of the fabric/textile substrate. The nanowires in the strands can also function as interconnections to connect one electronic device to another device on the clothing. In addition to interconnect, antenna and solar cells, other nano-particle components can be embedded into the fabric or textile such as sensors, data storage devices, memory and others disclosed in commonly-owned, copending application Ser. No. 11/064,363, the content of which is incorporated by reference.

In one embodiment, nano-sensors are mounted on a user's clothing. For example, sensors are woven into a single-piece garment (an undershirt) on a weaving machine. An optical fiber is integrated into the structure during the fabric production process without any discontinuities at the armhole or the seams. A nano-interconnection bus transmits information from (and to) sensors mounted at any location on the body thus creating a flexible "bus" structure. The strands or fibers serve as a data bus to carry the information from the sensors (e.g., EKG sensors) on the body. The sensors provide data to the interconnection bus and at the other end similar T-Connectors will be used to transmit the information to monitoring equipment or personal status monitor. Since shapes and sizes of humans will be different, sensors can be positioned on the right locations for all patients and without any constraints being imposed by the clothing. Moreover, the clothing can be laundered without any damage to the sensors themselves.

The above description and drawings are only illustrative of preferred embodiments which achieve the features and advantages of the present invention, and it is not intended that the present invention be limited thereto. The substrates can be used in a variety of ways including, but not limited to various articles of clothing, including informal garments, daily wear, workwear, activewear and sportswear, especially those for, but not limited to easily wet or stained clothing, such as formal garments, coats, hats, shirts, pants, gloves, and the like; other fibrous substrates subject to wetting or staining, such as interior furnishings/upholstery, carpets, awnings, draperies, upholstery for outdoor furniture, protective covers for barbecues and outdoor furniture, automotive and recreational vehicle upholstery, sails for boats, and the like.

Any modification of the present invention which comes within the spirit and scope of the following claims is considered part of the present invention.

What is claimed is:

1. A nano device, comprising:
   a. a first array of memory elements including ROM, PROM, EPROM, EEPROM, DRAM, SRAM, MRAM, FRAM, or SMM;
   b. a second array of nano memory elements spin coated and vertically stacked with the first array of memory elements; and
   c. a decoder coupled to the first and second arrays to select one of the memory elements.

2. The device of claim 1, wherein the nano memory elements are applied using a spin-coating technique.

3. The device of claim 1, comprising redundant memory elements to replace defective memory elements.

4. The device of claim 3, wherein the redundant memory elements are tested and each faulty memory element is deselected prior to operation.

5. The device of claim 3, wherein the nano memory elements self-organize to select functional memory elements and deselect defective memory elements.

6. The device of claim 3, wherein the nano memory elements comprise a neural network to detect defective memory elements using genetic algorithm.

7. The device of claim 1, wherein data is stored in one of: a red-ox state, a physical deformation of the nano memory element, a charge stored across the nano memory element.

8. The device of claim 1, wherein the memory element comprises a nano-electro-mechanical system (NEMS).

9. The device of claim 1, wherein the memory element comprises a nanowire positioned above an electrode that, when actuated, performs one of: deforming the nanowire, flattening the nanowire, attaches the wire to the electrode, repels the wire away from the electrode.

10. The device of claim 9, wherein the nano-wires form a two-dimensional (2D) nano-scale crossbar.

11. The device of claim 1, comprising light harvesting nanowires to capture solar energy.

12. The device of claim 1, comprising an energy storage device coupled to the light harvesting nanowires.

13. The device of claim 1, comprising light emitting nanowires.

14. The device of claim 1, comprising an energy storage device coupled to the light emitting nanowires.

15. The device of claim 1, comprising a wash durable strand of clothing containing the memory elements.

16. An apparatus, comprising:
    a. a plurality of wash durable clothing strands;
    b. an array of nano electronic elements fabricated in the strands; and
    c. an array of memory elements including ROM, PROM, EPROM, EEPROM, DRAM, SRAM, MRAM, FRAM, or SMM coupled to the nano electronic elements.

17. The apparatus of claim 16, wherein the nano electronic elements comprises one of: light emitting nanowires, light harvesting nanowires, an energy storage device, an antenna.

18. The apparatus of claim 16, comprising a processor coupled to the memory elements.

19. The apparatus of claim 16, wherein the nano-electronic elements substantially remain after the strand is washed at least 40 times in accordance with the wash procedure of AATCC Test Method 130-1981.

20. A nano device, comprising:
    a wash durable material including a substrate having strands with void spaces in the strands and between the strands; and
    nano-particles filling at least a part of the void spaces and forming one or more projections on the substrate, wherein the nano-particle comprises an array of light emitting elements and an array of light harvesting elements stacked vertically with the array of light emitting elements.

* * * * *